US009119278B2

(12) United States Patent
Chrobak et al.

(10) Patent No.: US 9,119,278 B2
(45) Date of Patent: Aug. 25, 2015

(54) SYSTEM, METHOD AND APPARATUS FOR ALIGNING AND SYNCHRONIZING TARGET MATERIAL FOR OPTIMUM EXTREME ULTRAVIOLET LIGHT OUTPUT

(71) Applicant: Cymer, LLC, San Diego, CA (US)

(72) Inventors: Christopher C. Chrobak, San Diego, CA (US); William N. Partlo, Poway, CA (US); Igor V Fomenkov, San Diego, CA (US); Alexander I. Ershov, Escondido, CA (US); James H. Crouch, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/109,873

(22) Filed: Dec. 17, 2013

(65) Prior Publication Data

US 2014/0103229 A1    Apr. 17, 2014

Related U.S. Application Data

(62) Division of application No. 12/725,178, filed on Mar. 16, 2010, now Pat. No. 8,653,491.

(60) Provisional application No. 61/168,033, filed on Apr. 9, 2009, provisional application No. 61/168,012, filed on Apr. 9, 2009, provisional application No. 61/168,000, filed on Apr. 9, 2009.

(51) Int. Cl.
*H05G 2/00* (2006.01)
*G03F 7/20* (2006.01)
*G21K 5/00* (2006.01)

(52) U.S. Cl.
CPC ............ *H05G 2/005* (2013.01); *G03F 7/70033* (2013.01); *G21K 5/00* (2013.01); *H05G 2/003* (2013.01); *H05G 2/006* (2013.01)

(58) Field of Classification Search
CPC ........................................................ H05G 2/00
USPC ..................................................... 250/504 R
See application file for complete search history.

(56) References Cited

U.S. PATENT DOCUMENTS 5,268,554 A    12/1993    Ream
6,831,520 B2    12/2004    Gee (Continued)

FOREIGN PATENT DOCUMENTS

JP    2007258069 A    10/2007
JP    2008226462 A    9/2008

*Primary Examiner* — Robert Kim
*Assistant Examiner* — Eliza Osenbaugh-Stewar
(74) *Attorney, Agent, or Firm* — Martine Penilla Group, LLP

(57) ABSTRACT

An extreme ultraviolet light system and method includes a drive laser, a chamber including an extreme ultraviolet light collector and a target material dispenser including an adjustable target material outlet capable of outputting multiple portions of target material along a target material path. Also included: a drive laser steering device, a detection system including at least one detector and a controller coupled to the target material dispenser, the detector system and the drive laser steering device. The controller includes logic for detecting a location of the first portion of target material from the first light reflected from the first portion of target material and logic for adjusting the target material dispenser outlet to output a subsequent portion of target material to a waist of the focused drive laser. A system and a method for optimizing an extreme ultraviolet light output is also disclosed.

18 Claims, 12 Drawing Sheets

(56) References Cited

U.S. PATENT DOCUMENTS

| | | |
|---|---|---|
| 7,087,914 B2 * | 8/2006 | Akins et al. ............... 250/504 R |
| 7,372,056 B2 | 5/2008 | Bykanov et al. |
| 2005/0270511 A1 | 12/2005 | Dierichs et al. |
| 2006/0050355 A1 | 3/2006 | Godfreid et al. |
| 2006/0114956 A1 | 6/2006 | Sandstrom et al. |
| 2006/0192156 A1 * | 8/2006 | Hasegawa ................. 250/504 R |
| 2007/0001130 A1 * | 1/2007 | Bykanov et al. ........... 250/493.1 |
| 2007/0265606 A1 | 11/2007 | DeBenedictis et al. |
| 2007/0291350 A1 | 12/2007 | Ershov et al. |
| 2008/0035865 A1 | 2/2008 | Komori et al. |
| 2008/0087847 A1 * | 4/2008 | Bykanov et al. .......... 250/504 R |
| 2008/0197297 A1 | 8/2008 | Akins et al. |
| 2008/0267241 A1 | 10/2008 | Brown et al. |
| 2008/0304028 A1 | 12/2008 | Wassink |
| 2012/0019826 A1 | 1/2012 | Graham et al. |

\* cited by examiner

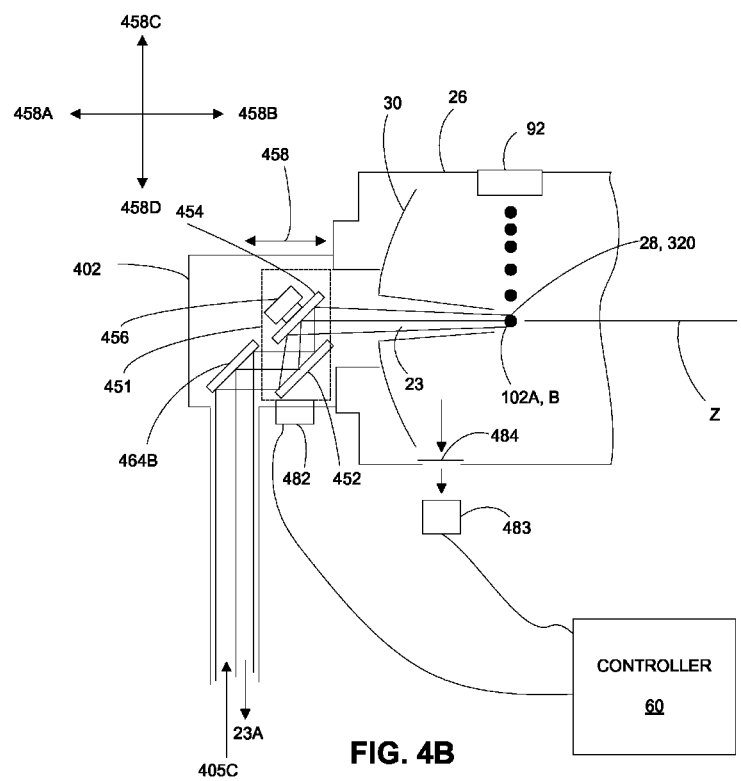
FIG. 4B
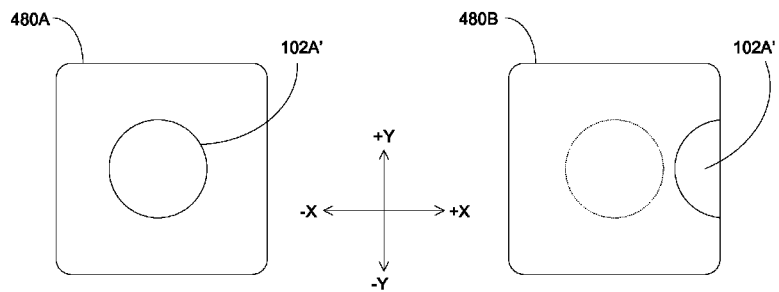
FIG. 4C.1          FIG. 4C.2

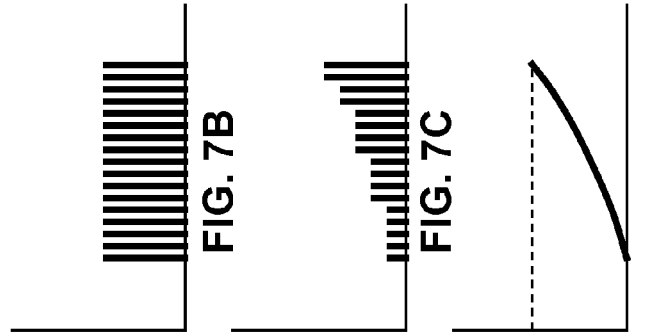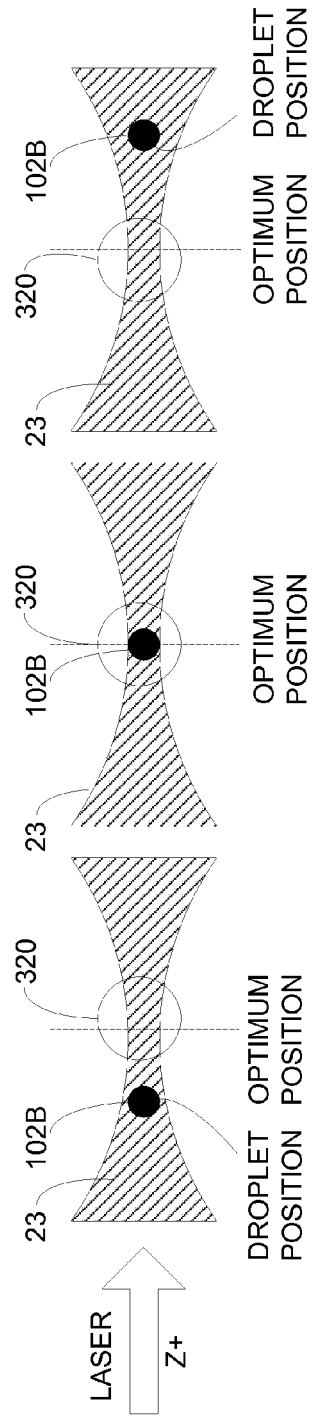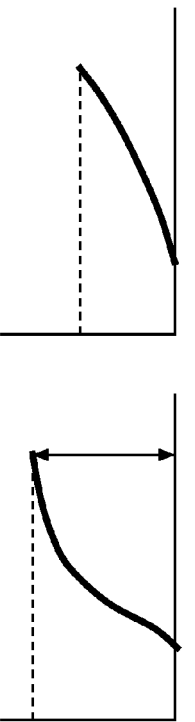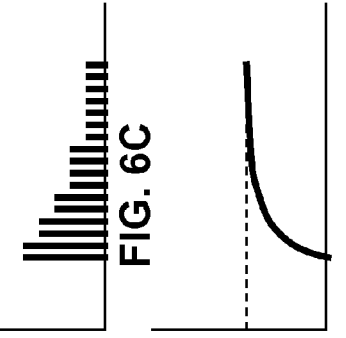

SYSTEM, METHOD AND APPARATUS FOR ALIGNING AND SYNCHRONIZING TARGET MATERIAL FOR OPTIMUM EXTREME ULTRAVIOLET LIGHT OUTPUT

CROSS REFERENCE TO RELATED APPLICATIONS

This application is a divisional of and claims priority from U.S. patent application Ser. No. 12/725,178 filed on Mar. 16, 2010 and entitled System, Method and Apparatus for Aligning and Synchronizing Target Material for Optimum Extreme Ultraviolet Light Output which is incorporated herein by reference for all purposes. This application also claims priority through, U.S. patent application Ser. No. 12/725,178, from U.S. Provisional Patent Application No. 61/168,033 filed on Apr. 9, 2009 and entitled "Extreme Ultraviolet Light Output," which is incorporated herein by reference in its entirety for all purposes. This application also claims priority from U.S. Provisional Patent Application No. 61/168,012 filed on Apr. 9, 2009 and entitled "System, Method and Apparatus for Laser Produced Plasma Extreme Ultraviolet Chamber with Hot Walls and Cold Collector Mirror," which is incorporated herein by reference in its entirety for all purposes. This application also claims priority from U.S. Provisional Patent Application No. 61/168,000 filed on Apr. 9, 2009 and entitled "System, Method and Apparatus for Droplet Catcher for Prevention of Backsplash in a EUV Generation Chamber," which is incorporated herein by reference in its entirety for all purposes.

BACKGROUND

The present invention relates generally to laser produced plasma extreme ultraviolet systems, methods and apparatus, and more particularly, to systems, methods and apparatus for droplet management in a laser produced plasma extreme ultraviolet system.

Laser produced plasma (LPP) extreme ultraviolet (EUV) systems produce a plasma by irradiating a plasma source material (e.g., target material) with a drive laser. The resulting plasma emits light and a desired wavelength, in this instance, EUV (e.g., less than about 50 nm wavelength).

To produce the optimum power output the drive laser ideally irradiates the target material. Unfortunately the drive laser can partially or completely miss the target material.

In view of the foregoing, there is a need for providing feedback for optimally aligning the drive laser to the target material and/or aligning the target material with the drive laser.

SUMMARY

Broadly speaking, the present invention fills these needs by providing an improved system and method for irradiating plasma target material in an optimum location for producing the maximum amount of emitted EUV light and the collection of the emitted EUV light. It should be appreciated that the present invention can be implemented in numerous ways, including as a process, an apparatus, a system, computer readable media, or a device. Several inventive embodiments of the present invention are described below.

One embodiment provides an extreme ultraviolet light system. The system includes a drive laser system, an extreme ultraviolet light chamber including an extreme ultraviolet light collector and a target material dispenser including a target material outlet capable of outputting a multiple portions of target material along a target material path, wherein the target material outlet is adjustable. The extreme ultraviolet light system further includes a drive laser steering device and a detection system. The detection system includes at least one detector directed to detect a reflection of the drive laser reflected from the target material. The system further includes a controller coupled to the target material dispenser, the detector system and the drive laser steering device. The controller detects a location of a first target material from a first light reflected from the first target material and adjusts the target material dispenser outlet to output a subsequent target material to a waist of the focused drive laser. The controller can also adjust a drive laser steering device to translate the waist of the drive laser with the target material.

The drive laser can be aligned with a light path between the drive laser and the first one of the portions of the target material. The detection system can be substantially in line with the light path and the reflection of the drive laser reflected off of the target material can be reflected along the light path toward the drive laser.

The drive laser system can also include an output window and the detection system may not be in line with the light path and the reflection of the drive laser can be reflected off of the target material and reflected along the light path toward the drive laser output window and the reflection of the drive laser can be further reflected off of the output window and toward the detection system.

The drive laser steering device can include at least one reflecting surface. An actuator can be coupled to the at least one reflecting surface so that the actuator can adjust the position of the at least one reflecting surface. The detector directed to detect light reflected from the target material can include a near field detector and/or a far field detector.

The drive laser system can include a CO2 laser. The drive laser system can include a master oscillator power amplifier configuration laser. The drive laser system can include a multi stage amplifier. The output window of the drive laser system can include a ZnSe window or a diamond window.

The waist of the focused drive laser is in an XY plane normal to a light path of the drive laser along a Z axis in the EUV chamber. The multiple portions of target material can be output along a target material path and the target material path can form an angle to the XY plane.

Another embodiment provides a method of generating an extreme ultraviolet light. The method includes irradiating a first one of multiple portions of a target material with a drive laser, detecting a first light pulse reflected from the first portion of the target material, determining a location of the first portion of the target material, adjusting a location of a second one of the multiple portions of the target material to a waist of a focused drive laser, irradiating the second portion of the target material with the drive laser. The waist of the focused drive laser can be aligned to the target material.

Detecting the first light pulse reflected from the first portion of the target material can include detecting the first light pulse reflected from an output window of the drive laser. Detecting the first light pulse reflected from the first portion of the target material can include determining at least one of a near field profile and/or a far field profile of the target material. Adjusting the waist of the focused drive laser can include adjusting a position of at least one reflecting surface of the drive laser.

Yet another embodiment provides a method of optimizing an extreme ultraviolet light output. The method includes determining an amount of each one of a first set of EUV output pulses during a selected time interval including for each one of the first set of EUV output pulses: placing a corresponding one of a first set of portions of target material in a waist of the focused drive laser, directing a focused laser pulse on the corresponding portion of target material, measuring an amount of a corresponding EUV output pulse and recording the measured corresponding EUV output pulse quantity. Each one of the first set of EUV output pulses is analyzed and a target material position is adjusted in +Z direction relative to the waist of the focused laser when the greatest peak EUV amount occurs in a first occurring portion of the first plurality of EUV output pulses and the target material position is adjusted in −Z direction relative to the waist of the focused laser when the greatest peak EUV amount occurs in a last occurring portion of the first plurality of EUV output pulses. An integral is calculated for the first set of EUV output pulses during the selected time interval. A timing of the drive laser and/or the target material can be adjusted to align the target material and the waist of the focused drive laser in the Y axis where the Y axis corresponds with a component of the target material path that is perpendicular to the Z axis. Steering the drive laser and/or the target material can include adjusting the drive laser and/or the target material to align the drive laser to the target material in the X axis, where the X axis is perpendicular to both the drive laser and the path of the target material.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIGS. 4A and 4B are more detailed schematics of the light source in accordance with embodiments of the disclosed subject matter.

FIGS. 4C.1-4C.2 are images of the reflected light reflected from preliminary droplet(s), in accordance with embodiments of the disclosed subject matter

FIGS. 6A, 7A and 8A are simplified close up views of the irradiation region, in accordance with embodiments of the disclosed subject matter.

FIGS. 6B, 7B and 8B are graphical representations of multiple focused light pulses corresponding to FIGS. 6A, 7A and 8A, respectively, in accordance with embodiments of the disclosed subject matter.

FIGS. 6C, 7C and 8C are graphical representations of the resulting multiple EUV pulses corresponding to the multiple focused light pulses in FIGS. 6B, 7B and 8B, respectively, in accordance with embodiments of the disclosed subject matter.

FIGS. 6D, 7D and 8D are graphical representations of corresponding integrals of the multiple resulting EUV pulses corresponding to FIGS. 6C, 7C and 8C, respectively, in accordance with embodiments of the disclosed subject matter.

DETAILED DESCRIPTION

Several exemplary embodiments for an improved system and method for irradiating plasma target material in an optimum location for producing the maximum amount of emitted EUV light and the collection of the emitted EUV light will now be described. It will be apparent to those skilled in the art that the present invention may be practiced without some or all of the specific details set forth herein.

An optimal location of the plasma target material yields a maximum EUV light output. The optimal location of the plasma target material includes several aspects. The drive laser imparts maximum energy to the target material by irradiating the target material in a waist of the focused drive laser. The target material can be slightly offset to one edge of the waist of the focused laser in a plane normal to the path of the laser, where the path of the drive laser into and through the EUV chamber is a Z axis and the plane normal to the Z axis is designated the X-Y plane. To correct for the offset, the target material can be directed back toward the waist of the focused drive laser and/or the drive laser can be steered to translate the waist to the target material path.

One LPP technique involves generating a stream of plasma target material and irradiating a portion of the target material with locating laser pulses followed by a main irradiating laser pulse. In more theoretical terms, LPP light sources generate EUV radiation by depositing light or laser energy into a target material having at least one EUV emitting element (e.g., xenon (Xe), tin (Sn) or lithium (Li)), creating a highly ionized plasma with electron temperatures of several 10's of eV. The energetic radiation generated during de-excitation and recombination of these ions is emitted from the plasma in all directions. The target material can be in the form of liquid droplets, or solid pellets, or a wire coated in and carrying liquid or solid target material, or a tape or strip of target material or other systems or methods of transporting the selected target material to the waist of the focused drive laser. A stream of plasma target material droplets is used herein as an exemplary embodiment only. Other forms of plasma target material can be used in similar manners as described herein.

In an exemplary arrangement that is currently being developed with the goal of producing about 100 W at the intermediate focus, a pulsed, focused 10-12 kW CO2 drive laser (or suitable other laser such as an excimer laser) is synchronized with a target material droplet generator to sequentially irradiate about 10,000-200,000 target material droplets per second. This arrangement produces a stable stream of droplets at a relatively high repetition rate (e.g., 10-200 kHz or more) and delivers the droplets to an irradiation site at or near the primary focus of the collector mirror with high accuracy and good repeatability in terms of timing and position over relatively long periods of time.

Figure 1:
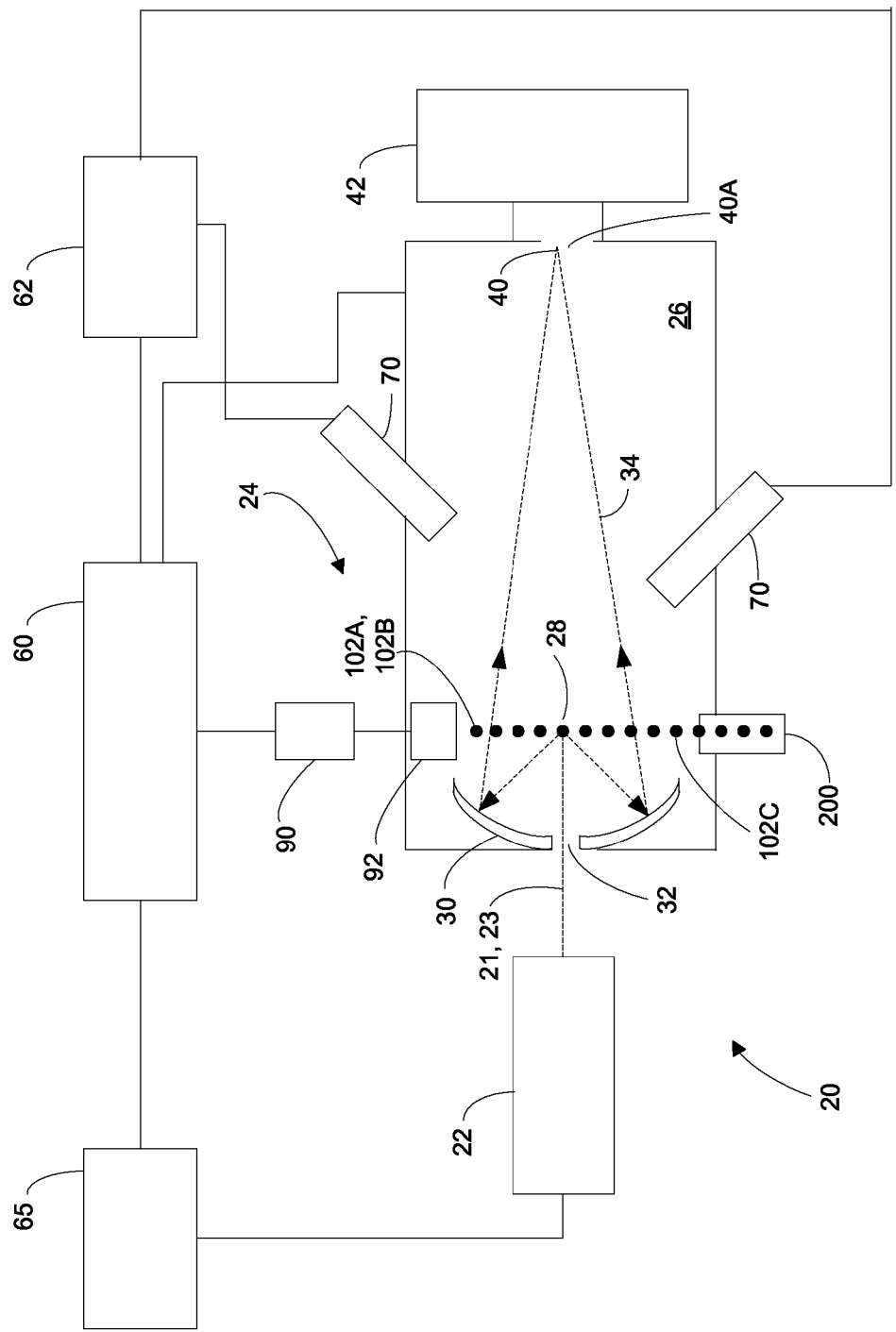
FIG. 1 is a schematic view of a laser-produced-plasma EUV light source, in accordance with embodiments of the disclosed subject matter.

FIG. 1 is a schematic view of a laser-produced-plasma EUV light source 20, in accordance with embodiments of the disclosed subject matter. The LPP light source 20 includes a light pulse generation system 22 for generating a train of light pulses and delivering the light pulses into a EUV chamber 26. Each light pulse 23 travels along a beam path 21 inside a beam transport system 25 from the light pulse generation system 22. The light pulse 23 is focused into the EUV chamber 26 to illuminate and/or irradiate a selected target droplet at an irradiation region 28.

Suitable lasers for use in the light pulse generation system 22 shown in FIG. 1, may include a pulsed laser device, e.g., a pulsed gas discharge CO2 laser device producing radiation at about 9.3 µm or about 10.6 µm, e.g., with DC or RF excitation, operating at relatively high power, e.g., about 10 kW or higher and high pulse repetition rate, e.g., about 10 kHz or more. In one particular implementation, the laser in the light pulse generation system 22 may be an axial-flow RF-pumped CO2 laser having a MOPA configuration with multiple stages of amplification and having a seed pulse that is initiated by a Q-switched master oscillator (MO) with low energy and high repetition rate, e.g., capable of 100 kHz operation. From the MO, the laser pulse may then be amplified, shaped, and focused before reaching the irradiation region 28.

Continuously pumped CO2 amplifiers may be used for the light pulse generation system 22. For example, a suitable CO2 laser device having an oscillator and multiple amplifiers (e.g., O-PA1-PA2 . . . configuration) is disclosed in co-owned U.S. Pat. No. 7,439,530, issued on Oct. 21, 2008, entitled, LPP EUV LIGHT SOURCE DRIVE LASER SYSTEM, the entire contents of which are hereby incorporated by reference herein.

Alternatively, the laser in the light pulse generation system 22 may be configured as a so-called "self-targeting" laser system in which the surface of the target material in the laser waist serves as one mirror of the optical cavity. In some "self-targeting" arrangements, a master oscillator may not be required. Self targeting laser systems are disclosed and claimed in co-owned U.S. Pat. No. 7,491,954, issued on Feb. 17, 2009, entitled, DRIVE LASER DELIVERY SYSTEMS FOR EUV LIGHT SOURCE, the entire contents of which are hereby incorporated by reference herein.

Depending on the application, other types of lasers may also be suitable for use in the light pulse generation system 22, e.g., an excimer or molecular fluorine laser operating at high power and high pulse repetition rate. Other examples include, a solid state laser, e.g., having a fiber, rod or disk shaped active media, a MOPA configured excimer laser system, e.g., as shown in U.S. Pat. Nos. 6,625,191, 6,549,551, and 6,567,450, the entire contents of which are hereby incorporated by reference herein, an excimer laser having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, a power oscillator/power amplifier (POPA) arrangement, or a solid state laser that seeds one or more excimer or molecular fluorine amplifier or oscillator chambers, may be suitable. Other light source designs are possible.

Referring again to FIG. 1, the EUV light source 20 may also include a target material delivery system 24, for delivering portions (e.g., droplets) of a target material into the interior of a EUV chamber 26 to the irradiation region 28, where the droplets 102A, 102B will interact with one or more light pulses 23, e.g., one or more pre-pulses and thereafter one or more irradiating pulses, to ultimately produce a plasma and generate an EUV emission 34. The target material may include, but is not necessarily limited to, a material that includes tin, lithium, xenon, etc., or combinations thereof. The EUV emitting element, e.g., tin, lithium, xenon, etc., may be in the form of liquid droplets and/or solid particles contained within liquid droplets 102A, 102B or other forms as described elsewhere herein.

By way of example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in co-owned U.S. Pat. No. 7,465,946, issued Dec. 16, 2008, entitled ALTERNATIVE FUELS FOR EUV LIGHT SOURCE, the contents of which are hereby incorporated by reference herein.

Referring further to FIG. 1, the EUV light source 20 includes a collector mirror 30. The collector mirror 30 is a near-normal incidence collector mirror having a reflective surface in the form of a prolate spheroid (i.e., an ellipse rotated about its major axis). The actual shape and geometry can of course change depending on the size of the chamber and the location of focus. The collector mirror 30 can include a graded multi-layer coating in one or more embodiments. The graded multi-layer coating can include alternating layers of Molybdenum and Silicon, and in some cases one or more high temperature diffusion barrier layers, smoothing layers, capping layers and/or etch stop layers.

The collector mirror 30 also includes an aperture 32. The aperture 32 allows the light pulses 23 generated by the light pulse generation system 22 to pass through to the irradiation region 28. The collector mirror 30 can be a prolate spheroid mirror that has a primary focus 31 within or near the irradiation region 28 and an intermediate focus 40. The EUV light 34 is output at or near the intermediate focus 40 from the EUV light source 20 and input to a downstream device 42 utilizing EUV light 34. By way of example, the downstream device 42 that receives the EUV light 34 can be an integrated circuit lithography tool (e.g., a scanner).

It is to be appreciated that other optics may be used in place of the prolate spheroid mirror 30 for collecting and directing EUV light 34 to the intermediate focus 40 for subsequent delivery to a device utilizing the EUV light. By way of example the collector mirror 30 can be a parabola rotated about its major axis. Alternatively, the collector mirror 30 can be configured to deliver a beam having a ring-shaped cross-section to the location of the intermediate focus 40 (e.g., co-pending U.S. patent application Ser. No. 11/505,177, filed on Aug. 16, 2006, entitled EUV OPTICS, the contents of which are hereby incorporated by reference).

The EUV light source 20 may also include a EUV controller 60. The EUV controller 60 can include a firing control system 65 for triggering one or more lamps and/or laser devices in the light pulse generation system 22 to thereby generate light pulses 23 for delivery into the chamber 26.

The EUV light source 20 may also include a target material position detection system including one or more target material imagers 70. The target material imagers 70 can capture images using CCD's or other imaging technologies and/or backlight stroboscopic illumination and/or light curtains that provide an output indicative of the position and/or timing of one or more target material droplets 102A, 102B relative to the irradiation region 28. The imagers 70 are coupled to and output the target material location and timing data to a target material position detection feedback system 62. The target material position detection feedback system 62 can compute a target material position and trajectory, from which a target material position error can be computed. The target material position error can be calculated on each portion of target material or an average basis (e.g., on a droplet by droplet basis or on average droplet data). The target material position error may then be provided as an input to the EUV controller 60. The EUV controller 60 can provide a position, direction and/or timing correction signal to the light pulse generation system 22 to control a source timing circuit and/or to control a beam position and shaping system to change the trajectory and/or focal power or focal point of the light pulses 23 being delivered to the irradiation region 28 in the chamber 26.

The EUV light source 20 can also include one or more EUV metrology instruments for measuring various properties of the EUV light generated by the source 20. These properties may include, for example, intensity (e.g., total intensity or intensity within a particular spectral band), spectral bandwidth, polarization, beam position, pointing, etc. For the EUV light source 20, the instrument(s) may be configured to operate while the downstream tool, e.g., photolithography scanner, is on-line, e.g., by sampling a portion of the EUV output, e.g., using a pickoff mirror or sampling "uncollected" EUV light, and/or may operate while the downstream tool, e.g., photolithography scanner, is off-line, for example, by measuring the entire EUV output of the EUV light source 20.

The EUV light source 20 can also include a target material control system 90, operable in response to a signal (which in some implementations may include the target material position error described above, or some quantity derived there from) from the EUV controller 60, to e.g., modify the release point of the target material from a target material dispenser 92 and/or modify target material formation timing, to correct for position errors in the target material droplets 102A, 102B arriving at the desired irradiation region 28 and/or synchronize the generation of target material droplets 102A, 102B with the light pulse generation system 22.

Figure 2A:
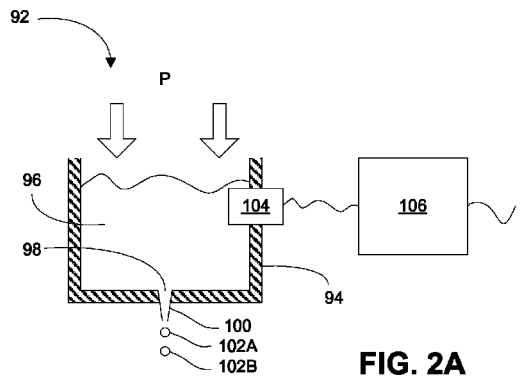
FIG. 2A is a schematic of the components of a simplified target material dispenser that may be used in some or all of the embodiments described herein in accordance with embodiments of the disclosed subject matter.

FIG. 2A is a schematic of the components of a simplified target material dispenser 92 that may be used in some or all of the embodiments described herein in accordance with embodiments of the disclosed subject matter. The target material dispenser 92 includes a conduit or reservoir 94 holding a fluid form of the target material 96. The fluid target material 96 can be a liquid such as a molten metal (e.g., molten tin), under a pressure, P. The reservoir 94 includes an orifice 98 allowing the pressurized fluid target material 96 to flow through the orifice 98 establishing a continuous stream 100. The continuous stream 100 subsequently breaks into a stream of droplets 102A, 102B. The target material dispenser 92 further includes a sub-system producing a disturbance in the fluid having an electro-actuatable element 104 that is operable, coupled with the fluid target material 96 and/or the orifice 98 and a signal generator 106 driving the electro-actuatable element 104.

More details regarding various target material dispenser 92 configurations and their relative advantages may be found in co-pending U.S. patent application Ser. No. 12/214,736, filed on Jun. 19, 2008, entitled SYSTEMS AND METHODS FOR TARGET MATERIAL DELIVERY IN A LASER PRODUCED PLASMA EUV LIGHT SOURCE; U.S. patent application Ser. No. 11/827,803, filed on Jul. 13, 2007, entitled LASER PRODUCED PLASMA EUV LIGHT SOURCE HAVING A DROPLET STREAM PRODUCED USING A MODULATED DISTURBANCE WAVE; co-pending U.S. patent application Ser. No. 11/358,988, filed on Feb. 21, 2006, entitled LASER PRODUCED PLASMA EUV LIGHT SOURCE WITH PRE-PULSE; co-owned U.S. Pat. No. 7,405,416, issued Jul. 28, 2008, entitled METHOD AND APPARATUS FOR EUV PLASMA SOURCE TARGET DELIVERY; and co-owned U.S. Pat. No. 7,372,056, issued May 13, 2008, entitled LPP EUV PLASMA SOURCE MATERIAL TARGET DELIVERY SYSTEM; the contents of each of which are hereby incorporated by reference.

The droplets 102A, 102B are between about 20 μm and about 100 μm in diameter. The droplets 102A, 102B are produced by pressurizing target material 96 through the orifice 98. By way of example, the orifice 98 can have a diameter of less than about 50 μm in one embodiment. The droplets 102A, 102B are launched at a velocity of about 20 to 70 m/s. Due to the high velocity of the droplets 102A, 102B, the droplet stay on the nearly straight target material 209 and do not impinge on the collector mirror 30, whether the droplets stream is produced in horizontal, vertical, or some other orientation.

Not all the droplets 102A, 102B produced by the target material dispenser 92 in continuous mode are used for plasma generation. If the EUV source works with a duty cycle of less than 100% a portion of the droplets 102C will pass the irradiation region 28 and can be collected thereafter in a first droplet catcher 210 or a second droplet catcher 240. The droplets 102C captured in the first droplet catcher 210 and the second droplet catcher 240 can be accumulated as a quantity of target material 211, 242 in the respective droplet catchers. The accumulated target material 211, 242 can be drained from the respective droplet catchers through an outlet 244. A portion 236 of the unused droplets 102C captured in the droplet catcher 210 can deflect inside the first droplet catcher. If the unused droplets 102C are allowed to impact the opposite wall of the EUV source chamber they will produce a large amount of fast moving fragments with broad spatial distribution. Significant portions of these fragments 231 will be deposited on the EUV collector mirror 30 and diagnostic ports and devices 70, thus affecting their performance.

Another source of the debris is the irradiation region 28. When irradiated with intense light pulses the droplets 102A, 102B are heated on one side that results in rapid asymmetric material expansion and EUV light emissions 230. As described above the EUV light emissions 230 are collected in the collector mirror 30. As a result of the expansion a significant amount of droplet material is accelerated in the direction away from the light pulse 23 with velocities comparable to the velocity of the droplets 102A, 102B as they are output from the target material dispenser 92. This material is traveling away from the irradiation region 28 until it strikes some surface, at which point it can be reflected or backsplashed in various directions. The backsplashed target material 231 may be deposited on the collector mirror 30.

Figure 2B:
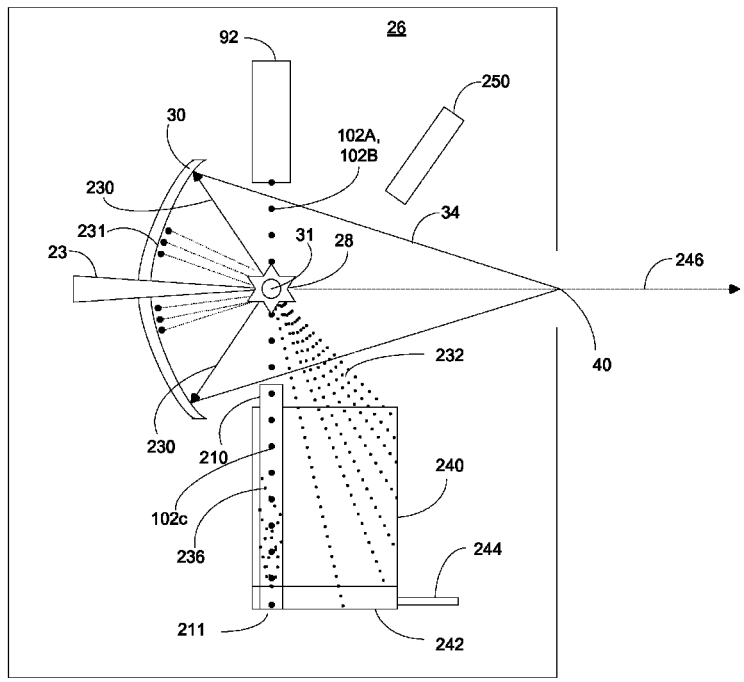
FIG. 2B is a more detailed schematics of some of the components in a EUV chamber in accordance with embodiments of the disclosed subject matter.

FIG. 2B is a more detailed schematic of some of the components in a EUV chamber 26 in accordance with embodiments of the disclosed subject matter. As described above, the target material dispenser 92 outputs a stream of droplets 102A, 102B, however, not all of the droplets are irradiated (i.e., used) to generate the EUV 34. By way of example unused droplets 102C are not irradiated by the incoming light pulses 23.

Figure 3A:
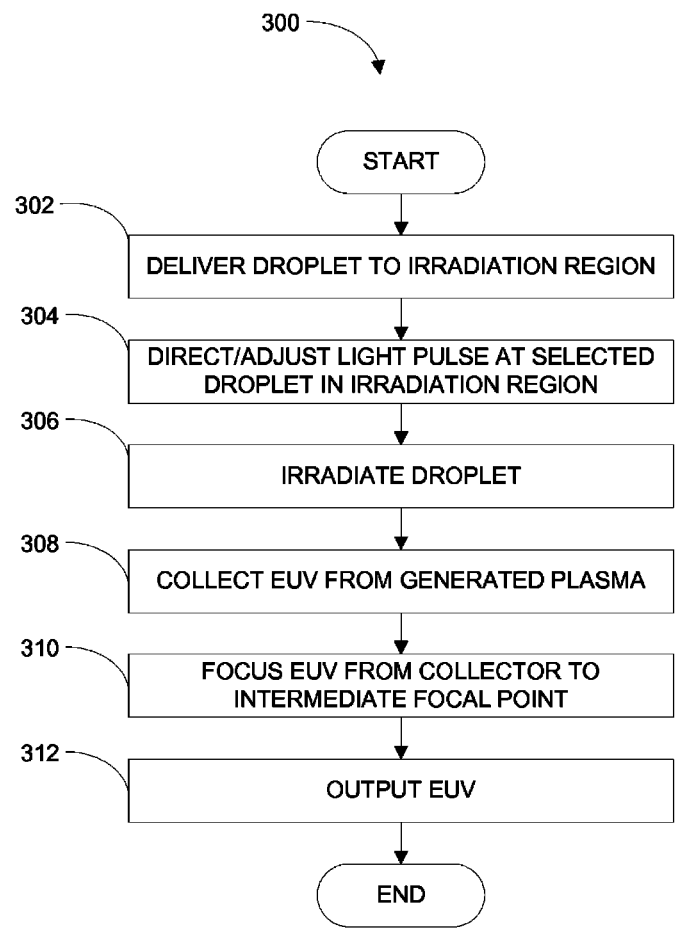
FIG. 3A is a flowchart diagram that illustrates the method operations performed in generating EUV, in accordance with embodiments of the disclosed subject matter.

FIG. 3A is a flowchart diagram that illustrates the method operations 300 performed in generating EUV 34, in accordance with embodiments of the disclosed subject matter. The operations illustrated herein are by way of example, as it should be understood that some operations may have sub-operations and in other instances, certain operations described herein may not be included in the illustrated operations. With this in mind, the method and operations 300 will now be described.

In an operation 302, a selected one 102C of a stream of droplets 102A, 102B is delivered to an irradiation region 28. In an operation 304, a light pulse 23 is directed to the irradiation region 28 in the EUV chamber 26 at substantially the same time the selected droplet 102B arrives at the irradiation region. EUV light 34 is generated from the irradiated droplet 102B in an operation 306.

Directing the light pulse 23 to the irradiation region 28 includes adjusting the focal point of the light pulse to an optimum location where the selected droplet 102B and the light pulse 23 meet. Optimizing the focus of the light pulse 23 imparts maximum energy from the light pulse 23 to the selected droplet. Adjusting the light pulse 23 to optimize the intersection of the light pulse and the selected droplet 102B is described in more detail below.

In an operation 308, the EUV from the irradiation region 28 is collected by the collector mirror 30. The collector mirror 30 focuses the EUV 34 to an intermediate location 40 in an operation 310 and in an operation 312, the EUV 34 is output from the EUV chamber.

Aligning the Target Material with the Drive Laser in the X-Y Plane

The precise location of the irradiation of the selected droplet 102B relative to the droplet itself and the drive laser is important as it determines the amount of energy imparted from the drive laser 23 to the droplet 102B and the amount of EUV generated therefrom that the collector mirror can collect and focus the collected EUV to the intermediate focal point 40. The downstream device 42 (e.g., scanner) of the EUV chamber 26 that consumes the EUV 34 determines the location of the intermediate point 40. The intermediate point 40 may vary slightly for many reasons including, for example, manufacturing and facility and changes or movement of work pieces within the downstream device 42.

The precise location of the waist 320 relative to the selected target material droplet 102B is correspondingly adjusted or steered to optimize the generation and collection of the EUV light 34.

Figure 3B:
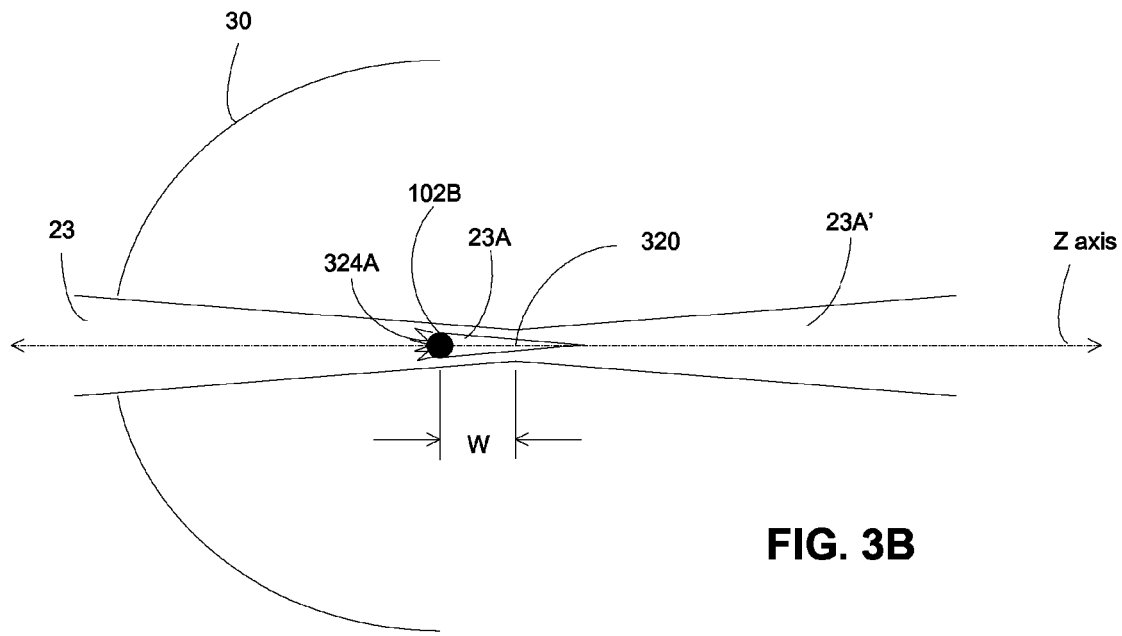
FIGS. 3B-E are simplified schematics of the irradiation of a portion of target material, in accordance with embodiments of the disclosed subject matter.

FIGS. 3B-E are simplified schematics of the irradiation of a portion of target material, in accordance with embodiments of the disclosed subject matter. The focused drive laser 23 is focused to a narrow cross-section beam referred to as a waist 320 where the drive laser is most concentrated. The optimum irradiation of the selected droplet 102A occurs at the waist 320 as the focused drive laser is most concentrated at the waist. As shown in FIG. 3B, the waist 320 is offset along the Z axis from the selected target portion of material (i.e., droplet 102B) by a distance W (e.g., waist 320 is offset from the target material path 394 by distance W). It should be noted that the offset distance W is not shown to scale and that W can be a relatively small distance such as less than about 5 µm to about 20 mm. Plasma 324A is generated as the focused drive laser 23 irradiates the target material droplet 102B, however as the droplet is not aligned with the waist 320, only a first portion 23A of the focused drive laser 23 impinges on and irradiates the droplet while a second portion 23A' of the focused drive laser 23 passes the droplet. Thus, only the amount of energy in the first portion 23A of the focused drive laser 23 is applied to the droplet 102B. As a result, less than optimum energy is imparted from the focused drive laser 23 to the droplet 102B and the resulting plasma 324A and EUV produced is correspondingly reduced.

Figure 3C:
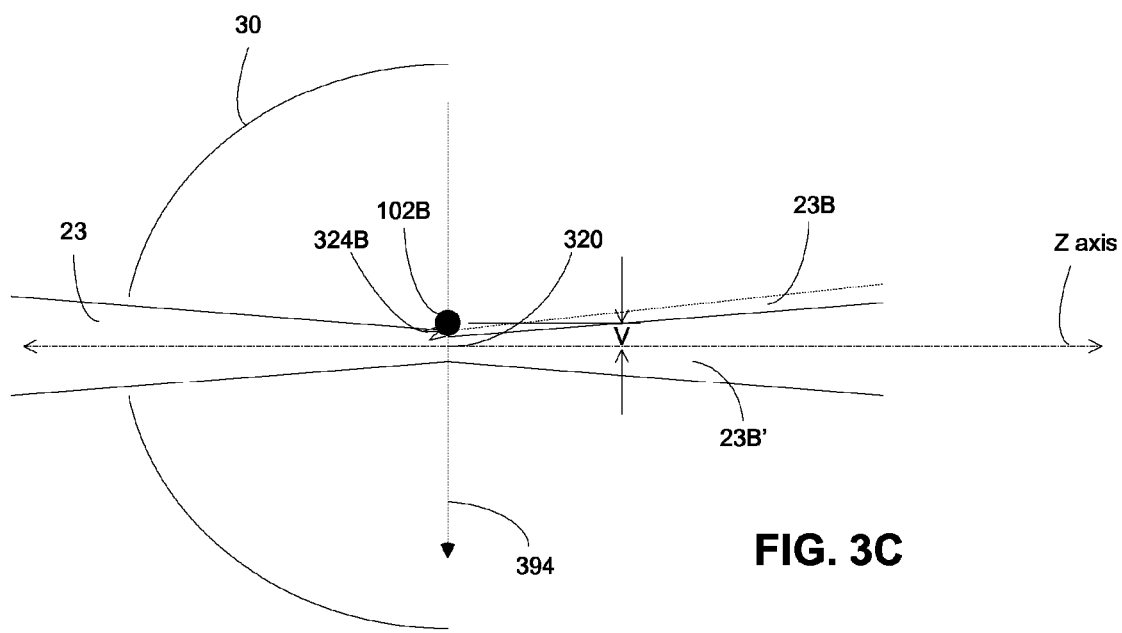

FIG. 3C shows a side view of the irradiation of the selected portion of target material (i.e., droplet 102B) such that the target material path 394 is across the view. As shown in FIG. 3C, the waist 320 is aligned to the path 394 of the droplet 102B (e.g., W equals approximately zero). However, in FIG. 3C the droplet 102B is shown offset a distance V from the Z axis. The droplet 102B follows the target material path 394. If the drive laser 23 uses the droplet 102B as a mirror for the optical cavity then when the droplet is aligned with the drive laser 23, the drive laser will also very nearly simultaneously arrive and thus irradiate the droplet. If the drive laser 23 does not use the droplet 102B as a mirror for the optical cavity, then only a first portion 23B of the focused drive laser 23 impinges on and irradiates the droplet while a second portion 23B' of the focused drive laser 23 passes the droplet. Thus, only the amount of energy in the first portion 23B of the focused drive laser 23 is applied to the droplet 102B. As a result, less than optimum energy is imparted from the focused drive laser 23 to the droplet 102B and the resulting plasma 324B and EUV produced is correspondingly reduced. The drive laser 23 can be aligned by steering the drive laser to the droplet 102B if the drive laser 23 and the droplet are timed so that the droplet arrives at the waist 320 as the drive laser 23 is output to the waist.

Figure 3D:
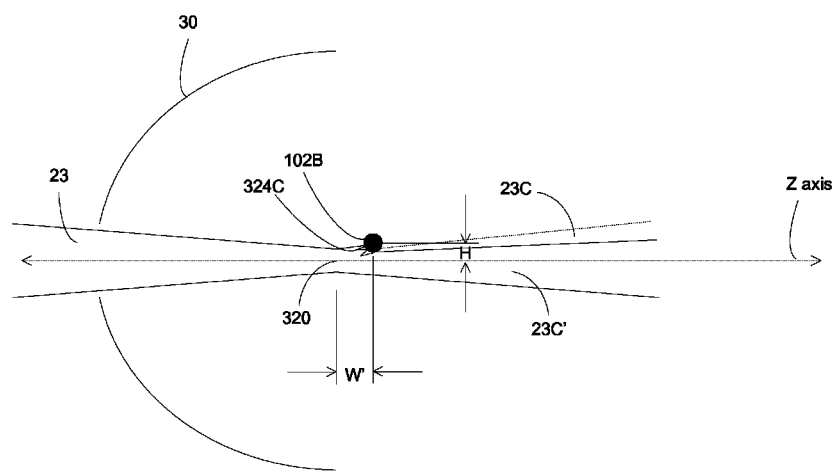

FIG. 3D shows a top view of the selected portion of target material (i.e., droplet 102B) such that the target material path 394 is not visible as it passes perpendicular (e.g., into) the page. As shown in FIG. 3D, the droplet 102B is shown offset a distance H from the Z axis and a distance W' from the waist 320. As the droplet 102B follows the target material path 394 it will not pass through the waist 320 and therefore the droplet will not be irradiated optimally by the focused drive laser 23 as only a first portion 23C of the focused drive laser 23 impinges on and irradiates the droplet 102B while a second portion 23C' of the focused drive laser 23 passes the droplet. Thus, only the amount of energy in the first portion 23C of the focused drive laser 23 is applied to the droplet 102B. As a result, less than optimum energy is imparted from the focused drive laser 23 to the droplet 102B and the resulting plasma 324C and EUV produced is correspondingly reduced.

Figure 3E:
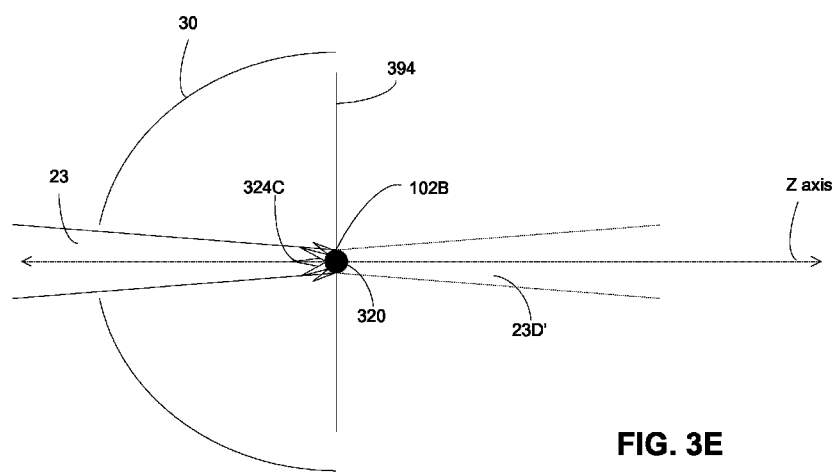

FIG. 3E shows a side view of the selected portion of target material (i.e., droplet 102B). As shown in FIG. 3E, the droplet 102B is shown aligned with the waist 320 of the focused drive laser 23. The droplet is also aligned with the Z axis. A top view of the droplet 102B aligned with the waist 320 of the focused drive laser 23 would also appear as shown in FIG. 3E except the target material path 394 would not be shown as described in FIG. 3D above. As the droplet 102B is aligned with both the waist 320 and the Z axis, substantially the entire focused drive laser 23 impinges on the droplet 102B and substantially none of the focused drive laser 23 passes the droplet 102B (e.g., portion 23D' is substantially non-existent). Therefore, the droplet 102B will be irradiated optimally by the focused drive laser 23 and substantially all of the energy in the focused drive laser 23 is applied to the droplet 102B. As a result, the resulting plasma 324D and EUV produced is correspondingly optimized.

Figure 4A:
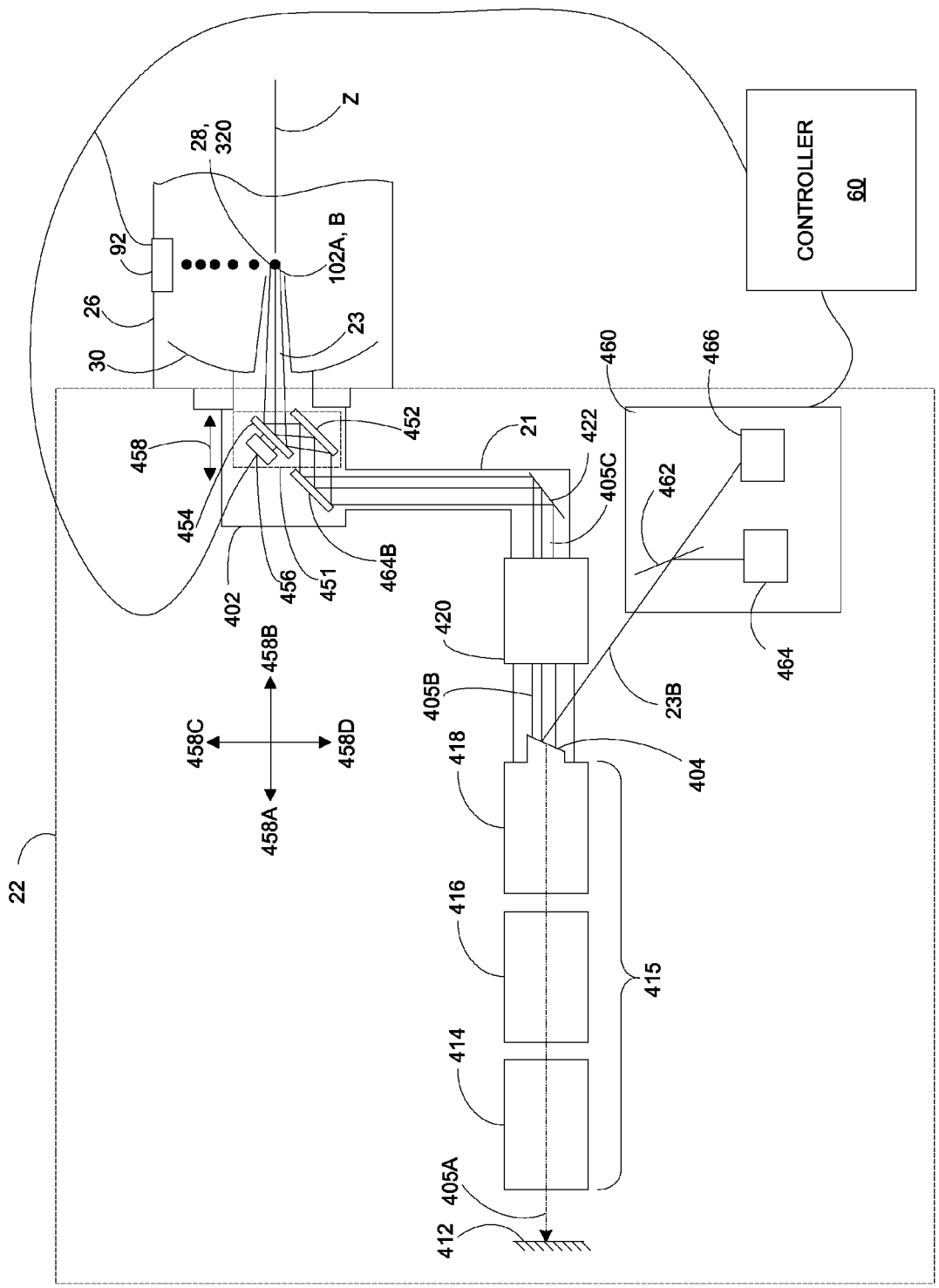
Figure 5A:
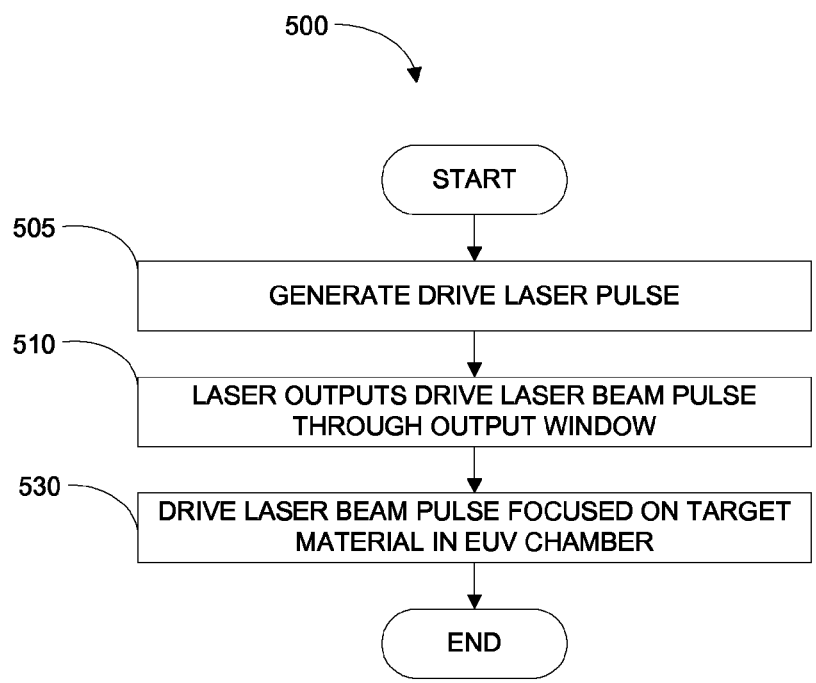
FIG. 5A is a flowchart diagram that illustrates the method operations performed in generating EUV, in accordance with embodiments of the disclosed subject matter.

FIGS. 4A and 4B are more detailed schematics of the light source 22, in accordance with embodiments of the disclosed subject matter. FIG. 5A is a flowchart diagram that illustrates the method operations 500 performed in generating EUV 34, in accordance with embodiments of the disclosed subject matter. The operations illustrated herein are by way of example, as it should be understood that some operations may have sub-operations and in other instances, certain operations described herein may not be included in the illustrated operations. With this in mind, the method and operations 500 will now be described.

Light source 22 includes a laser 415. The laser 415 can include one or more laser generating and amplifying chambers 414, 416, 418 between an output window 404 and a beam reverser 412. The laser 415 can be a master oscillator and power amplifier (MOPA) configuration or a no master oscillator (NOMO) configuration. In an operation 505, the laser 415 produces and amplifies a laser beam pulse 405A in the laser generating and amplifying chambers 414, 416, 418. In an operation 510, the laser 415 outputs a laser beam pulse 405B through the output window 404.

The laser beam pulse 405B is directed to the irradiation region 28 by reflecting surfaces or planes 464B, 452 and 454 in an operation 530. By way of example, one or more of reflecting surfaces or planes 464B, 452 and 454 can be a focusing of converging surface to cause the expanded laser beam pulse 405C to converge and form the focused light 23 which converges to the waist 320 as shown in FIGS. 3B-E above. In optional operations not shown, directing the laser beam pulse to the irradiation region can include inputting the output laser beam pulse 405B to a beam expander 420. The beam expander 420 expands the pulse width of the laser beam pulse to an expanded laser beam pulse that is output from the beam expander 420. The expanded laser beam pulse can be directed toward the irradiation region 28 along a beam path 21 or beam transport system via reflecting surfaces or planes 422, 464B, 452 and 454. The reflecting surfaces or planes 422, 464B, 452 and 454 can be mirrors or prisms or other suitable reflective media. The beam path 21 can be maintained at a vacuum (e.g., less than about 1 mTorr) and can also include hydrogen gas between the output window 404 and the irradiation region 28.

One or more of reflecting surfaces or planes 464B, 452 and 454 can be movable to steer the location of the waist 320 in the irradiation region 28. By way of example actuator 456 can move reflecting surface or plane 454 in one or more of directions 458A-D. The actuator 456 can be a piezoelectric actuator or a stepper motor controlled micro meter or any other suitable type of actuator. Reflecting surface 452 can be an off-axis parabolic mirror or a transmissive optic (e.g., a lens). This lens can be translated along the optic axis to change the position of the waist of the focused laser. Reflecting surface 454 can be a flat mirror directing the converging drive laser 23 along the desired light path along the Z-axis in the EUV chamber. Reflecting surface 464B can be a flat mirror for reflecting the expanded pulse 405C toward the off-axis parabolic mirror 452. By way of example, the mirror 454 can receive the laser 405C beam from off-axis parabolic focusing mirror 452 and steers the converging, laser 23 to the waist 320 at the primary focus 31 of the collector mirror 30.

Moving the reflecting surface or plane 454 in one or more of directions 458A-D steers the waist 320 in the irradiation region 28 such that the waist 320 is more precisely aligned with the target material. This imparts the maximum energy in the focused light 23 on the selected droplet 102B. Moving the reflecting surface or plane 454 in one or more of directions 458A-D steers the waist 320 in an X-Y plane normal to the Z axis where the Z axis is the path of the focused drive laser 23 into and through the EUV chamber 26. Moving the reflecting surface or plane 454 in one or more of directions 458A-D can also steer the waist 320 along the Z axis (e.g., −Z or +Z) either closer to or further away from the collector mirror 30.

The output window 404 can be any suitable output window. By way of example the output window 404 can be ZnSe or diamond output window. The output window 404 can optionally include an optical power to focus the laser 405B as it passes through the output window 404.

Figure 5B:
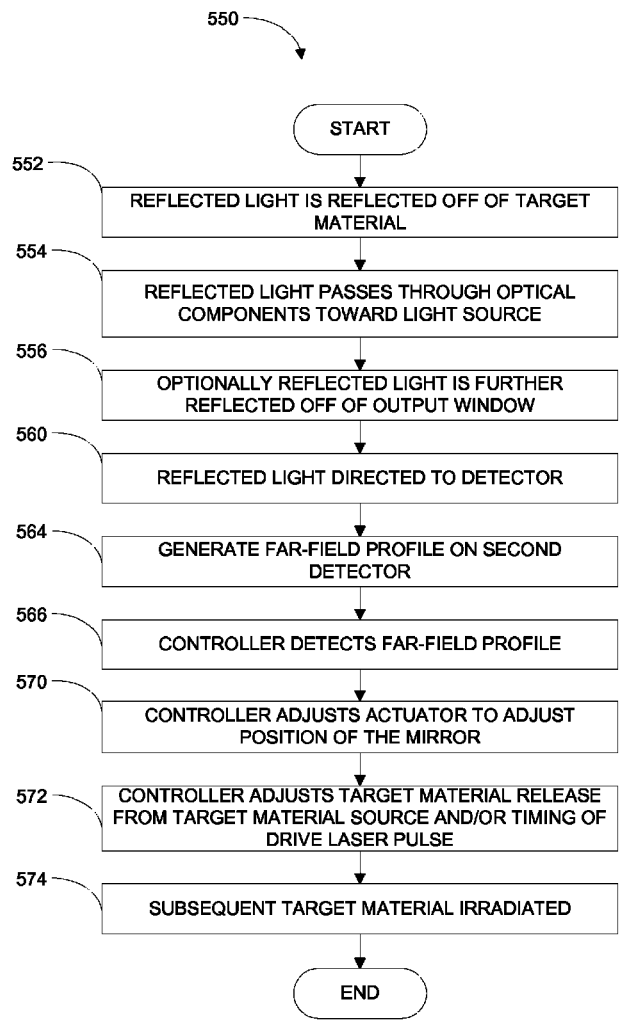
FIG. 5B is a flowchart diagram that illustrates the method operations performed in adjusting the position of the waist relative to the target material, in accordance with embodiments of the disclosed subject matter.

FIG. 5B is a flowchart diagram that illustrates the method operations 550 performed in adjusting the position of the waist 320 relative to the target material, in accordance with embodiments of the disclosed subject matter. The operations illustrated herein are by way of example, as it should be understood that some operations may have sub-operations and in other instances, certain operations described herein may not be included in the illustrated operations. With this in mind, the method and operations 550 will now be described.

Referring also to FIG. 4A, a portion 23A of light from the focused laser beam 23 is reflected off of at least one preliminary droplet 102A in the droplet stream following the target material path 394 in operation 552. The reflected light 23A is reflected back through the optical components 454, 452, 464B 422, 420 toward light source 22 in operation 554.

The detector system 460 can be inline with the light path 21. Optionally, the detector system 460 can be off to one side of the light path 21 and the reflected light 23A can be reflected off the output window 404 in an operation 556 as light 23B. The reflected light 23A or 23B is directed toward the detector system 460 in an operation 560.

The detector system 460 can include a near field detector 466 and a far field detector 464. The reflected light 23B is monitored in far field detector 464 and optionally in the near field detector 466 in operation 564. In one configuration only one of the near field detector 466 and the far field detector 464 may be included in the detector system 460. By way of example the detector system 460 can include only the far field detector 464 or alternatively, only the near field detector 466.

Light 23B reflected from the output window 404 to generate a near-field profile on a near field detector 466. Light 23B reflected from the output window 404 can also or alternatively be used to generate a far-field profile on the far field detector 464. The near-field and/or far-field profiles indicate the XY position of the at least one preliminary droplet 102A relative to the waist 320 or Z axis of the drive laser 23.

FIGS. 4C.1-4C.2 are far-field profile images 480A, 480B of the reflected light 23A, 23B reflected from preliminary droplet(s) 102A, in accordance with embodiments of the disclosed subject matter. FIG. 4C.1 is an image 480A of the reflected light 23A, 23B reflected from an aligned preliminary droplet 102A. The aligned droplet image 102A' is a full droplet in cross-sectional area and is substantially centered in the image 480A. Due to the full droplet in cross-sectional area the amount of reflected light 23A or 23B is a maximum value and thus the focused drive laser 23 fully impinges on the droplet 102A.

FIG. 4C.2 is an image 480B of the reflected light 23A, 23B reflected from a misaligned preliminary droplet 102A. The misaligned droplet image 102A' is not a full droplet in cross-sectional area and is substantially offset to right (+X direction) in the image 480B. If less than the full droplet cross-section appears in the in image 480B, then the image of the droplet 102A is not centered and the droplet is less than optimally aligned with the waist 320 of the focused drive laser 23. The deviation of the droplet image position from an optimum position provides the signal used to steer the drive laser 23.

The detected location of the preliminary droplet(s) 102A can be compared to a location of the waist 320 and/or Z axis of the focused drive laser 23 based on the amount of reflected light 23A or the position of the reflected image 102A' and a resulting difference value is converted into an error signal by the controller 60. The error signal is used to adjust (e.g., tip/tilt in at least one of directions 458A-D) mirror 454 using actuator 456. By way of example, the tip/tilt adjustment can be made as multiple droplets are irradiated by the light 23 until the error signal is a null.

The controller 60 detects one or both the near-field and far-field images of the reflected light 23A or 23B in an operation 566. In an operation 570, the controller 60 adjusts the actuator 456 to adjust the position of the mirror 454 and thereby steer the precise location of the waist 320 relative to the waist 320 and/or Z axis of the focused drive laser 23. In an optional or alternative operation 572, the controller 60 adjusts the release of at least one subsequent droplet(s) 102B from the droplet generator 92 and/or adjusts a timing of the drive laser pulse 23. The adjustment can include adjusting the timing of the release of the subsequent droplet and can include adjusting the direction of the target material path 394.

In an operation 574, at least one subsequent droplet 102B arrives at the waist 320 of the focused drive laser 23 and the droplet 102B to impart the maximum amount of energy from the focused light 23 to the droplet 102B thus irradiating the droplet 102B and producing an optimum amount of EUV light 34.

A first pulse of the focused light 23 can have a lower energy than a second pulse of the focused light 23 where the first pulse of the focused light 23 irradiates the preliminary droplet(s) 102A to determine a location of the preliminary droplet(s) 102A. The second pulse of the focused light 23 is directed at the subsequent droplet(s) 102B to irradiate the subsequent droplet(s). The method and operations 550 can continuously repeat for subsequent droplets.

The light source 22 can be a CO2 laser. The light source 22 can be a NOMO configuration (e.g. no master oscillator is used) and an optical cavity is established between the beam reverser 412 and a droplet 102A, 102B when the droplet reaches the Z-axis in the EUV chamber 26. An amplifier 415 can include a chain of amplifier chambers 414, 416, 418, each chamber having its own gain media and excitation source to amplify light in the cavity.

Light 23A reflected from the first droplet 102A is directed toward the beam reverser 412 and is at least partially reflected by the output 404 window as reflected light 23B. The output 404 window can be placed at an angle to the beam path 21. Placing the window at a slight angle can also prevent direct reflections along the drive laser beam path as any reflections from light along the beam path would be directed out of the beam path. By way of example the output 404 window can be placed at or near the Brewster's angle. At an ideal Brewster's angle to the path of the laser, the output window 404 is completely transparent and passes 100% of the light. Typically the output window absorbs or reflects up to about 2% of the light and passes the remaining light (about 98%).

On one side of the output window 404 is a CO2 gain media. The opposite side of the window 404 is in fluid communication with the irradiation region 28 via the beam path 21. The beam path 21 is maintained at a vacuum and in at least one embodiment can include hydrogen at a pressure of less than about 1 mTorr.

Figure 4D:
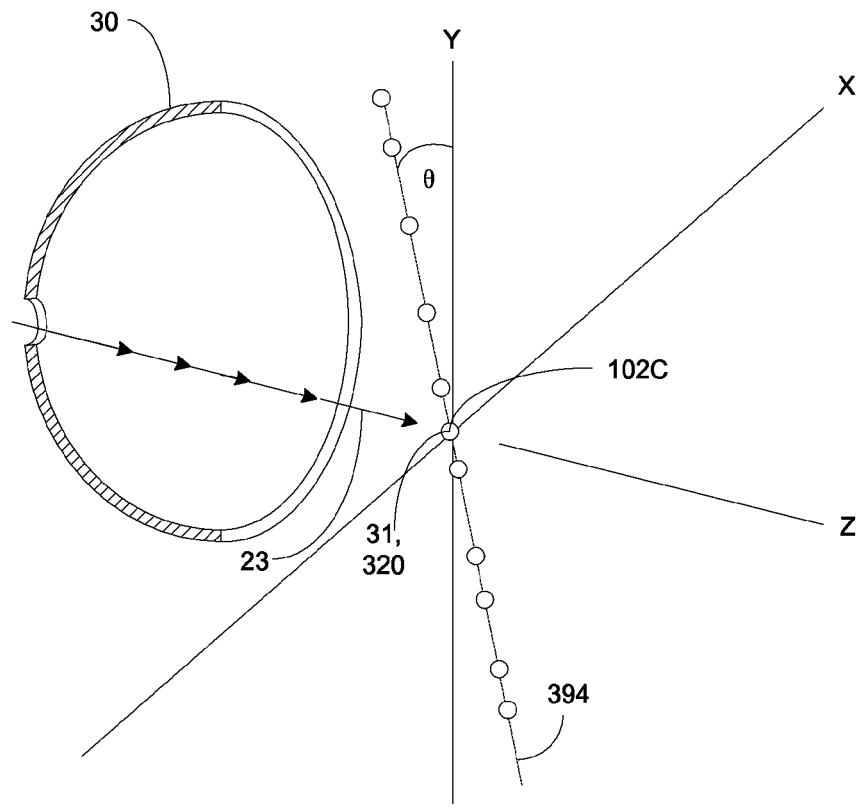
FIG. 4D is a simplified schematic of the target material, in accordance with embodiments of the disclosed subject matter.

FIG. 4D is a simplified schematic of the target material 394, in accordance with embodiments of the disclosed subject matter. The target material path 394 can be at an angle θ relative to the X-Y plane normal to the Z-axis, in accordance with embodiments of the disclosed subject matter. θ can be any angle from about between about 90 degrees and 0 degrees relative to the X-Y plane. The X-Y plane is perpendicular to the Z axis. The X and Y axes correspond to angular components of the target material path 394.

EUV Z Axis Optimization

The above systems and methods describe the alignment for the target material and the drive laser for optimum calculated result for the optimum EUV output. However the above described systems and methods do not accurately compensate for dynamic changes in the EUV chamber 26 and more specifically the dynamic conditions occurring at the primary focus 31 of the collector mirror 30 during the production of the plasma and the resulting EUV 34.

Referring again to FIG. 4B above, the filter 484 filters out of band light (e.g., visible light) and passes EUV to detector 483. The detector 483 couples a signal corresponding to the amount of detected EUV to the controller 60. The controller 60 analyzes the amount of detected EUV and sends a correction signal to the drive laser focusing system 402. The analysis of the amount of detected EUV includes comparing the detected EUV signal to another EUV signal level such as a previous EUV signal or a desired EUV signal. The filter 484 can be a thin film filter such as a thin film of zirconium having a thickness of about 0.2 micron as such a thin film is opaque to visible light but substantially fully transmissive to EUV. The detector 485 can be any suitable EUV detector. By way of example the detector 485 can be a broad spectrum photodiode. The detector 485 can be a broad spectrum photodiode having a relatively large area (e.g., an area of less than about 50 square millimeters to more than about 100 square millimeters).

Common stage 482 includes an actuator and allows the mirrors 452, 454 to be moved as a single stage in direction 458A and 458B. This allows the waist 320 of the focused drive laser 23 to be translated along the Z-axis having the same focal length and also adjusting the distance of waist 320 from the collector mirror 30 along the Z-axis. Used in combination, the common stage 482 and the actuator 456 allows the waist 320 of the drive laser to be selectively translated within a range of values in the X-Y plane and at different distances from the collector mirror 30 along the Z-axis. By way of example the common stage 482 and the actuator 456 allows the waist 320 to be aligned with the primary focus 31 of the collector mirror 30.

FIGS. 6A, 7A and 8A are simplified close up views of the irradiation region 28 in accordance with embodiments of the disclosed subject matter. FIGS. 6B, 7B and 8B are graphical representations of multiple focused light pulses 23 corresponding to FIGS. 6A, 7A and 8A, respectively, in accordance with embodiments of the disclosed subject matter. FIGS. 6C, 7C and 8C are graphical representations of the resulting multiple EUV pulses 34 corresponding to the multiple focused light pulses in FIGS. 6B, 7B and 8B, respectively, in accordance with embodiments of the disclosed subject matter. FIGS. 6D, 7D and 8D are graphical representations of corresponding integrals of the multiple resulting EUV pulses 34 corresponding to FIGS. 6C, 7C and 8C, respectively, in accordance with embodiments of the disclosed subject matter.

Figure 9:
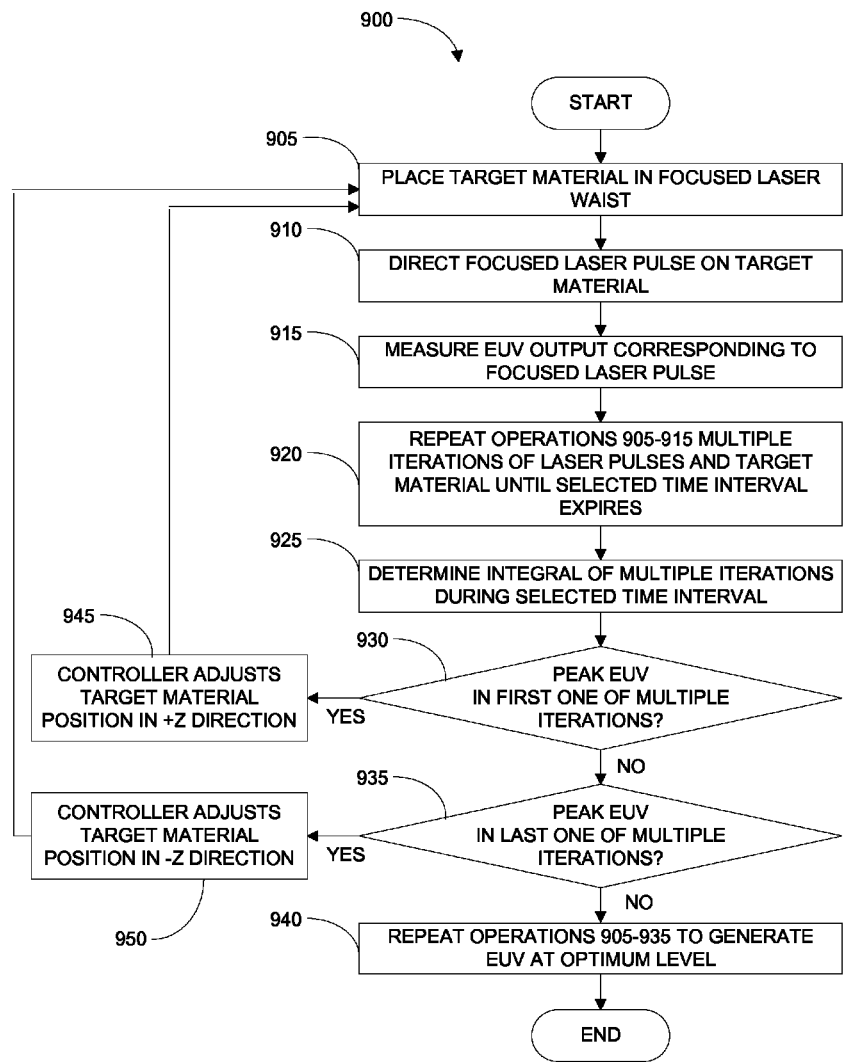
FIG. 9 is a flowchart diagram that illustrates the method operations performed in adjusting the position of the waist relative to the target material to optimize EUV output, in accordance with embodiments of the disclosed subject matter.

FIG. 9 is a flowchart diagram that illustrates the method operations 900 performed in adjusting the position of the waist 320 relative to the target material to optimize EUV 34 output, in accordance with embodiments of the disclosed subject matter. The operations illustrated herein are by way of example, as it should be understood that some operations may have sub-operations and in other instances, certain operations described herein may not be included in the illustrated operations. With this in mind, the method and operations 900 will now be described.

In an operation 905, a target material 102B is placed in the waist 320 of the focused laser 23. A focused laser pulse 23 is directed on the target material 102B in an operation 910.

In an operation 915, the EUV output pulse corresponding to focused laser pulse 23 in operation 910 is measured (e.g., by detector 483 or via a feedback signal from the downstream device 42). In an operation 920, operations 905-915 are repeated multiple iterations of focused laser pulses and subsequent portions of target material 102B while incrementing the location of the subsequent portions of target material in the –Z direction relative to the waist 320 until a selected time interval expires. By way of example, a 1 ms time interval can be selected and however many laser pulses and target material portions (e.g., droplets in one embodiment) 102B can be delivered to the waist 320 of the focused laser pulses.

In an operation 925, an integral of multiple iterations during selected time interval is determined. The area under the curve of the integral corresponds to the EUV output 34 over the selected time interval.

In an operation 930, the recorded EUV pulses across the multiple iterations during the selected time interval are examined to determine which pulse or pulses have the greatest peak EUV. If the greatest peak EUV occurs in the first one of multiple iterations then the operations continue in an operation 945. In operation 945, the controller adjusts target material position in +Z direction relative to the waist 320 of the focused laser 23.

In operation 930, if the greatest peak(s) EUV do not occur in the first one of multiple iterations then the operations continue in an operation 935. In operation 935, the recorded EUV pulses across the multiple iterations during selected time interval are examined to determine which pulse or pulses have the greatest peak EUV. If the greatest peak EUV occurs in the last one of multiple iterations then the operations continue in an operation 950. In operation 950, the controller adjusts target material position in –Z direction relative to the waist 320 of the focused laser 23.

In operation 935, if the greatest peak(s) EUV do not occur in the last portion of multiple iterations then the operations continue in an operation 940. In operation 940 repeat operations 905-935 to generate EUV at optimum level until the EUV 34 is no longer needed and the method operations can end.

Referring to FIGS. 6A-6D, the droplet is in the +Z position relative to the waist 320 of the focused drive laser 23. The tapering EUV output indicates droplet position is slightly offset in the –Z direction from the optimum location in or near waist 320 of the focused laser 23. As a result the output EUV pulses 34 shown in FIG. 6C are less than optimum having a high initial energy that quickly tapers downward. The focusing optics move in –Z direction or droplets in +Z direction.

It should be understood that the relative positions of the target material 102B and the waist 320 of the focused laser 23 are somewhat exaggerated in the FIGS. 6A-8A so as to emphasize the relative movement. The actual change in location can be less than about a diameter of the target material 102B. Further the optimum position may be slightly offset on the Z axis from a center of the waist 320 of the focused laser 23. The waist 320 can have a width wider than the target material 102B.

Referring to FIGS. 7A-7D, the droplet is in the –Z position relative to the waist 320 of the focused drive laser 23. The increasing EUV output indicates droplet position is beyond optimum focal point. As a result the output EUV pulse 34 shown in FIGS. 7C and 7D is less than optimum having a low initial energy that quickly tapers upward to an abruptly terminated peak. Move optics in +Z direction or droplets in –Z direction.

Referring to FIGS. 8A-8D, the droplet is in the optimum position (e.g., desired focal point). As a result the output EUV pulse 34 shown in FIGS. 8C and 8D is optimized having more consistent energy (e.g., fewer peaks or steep slopes) throughout the pulse as compared to either of those shown in FIGS. 6C and 6D or FIGS. 7C and 7D. The more consistent energy provides more consistent results in the downstream device 42.

Figure 10:
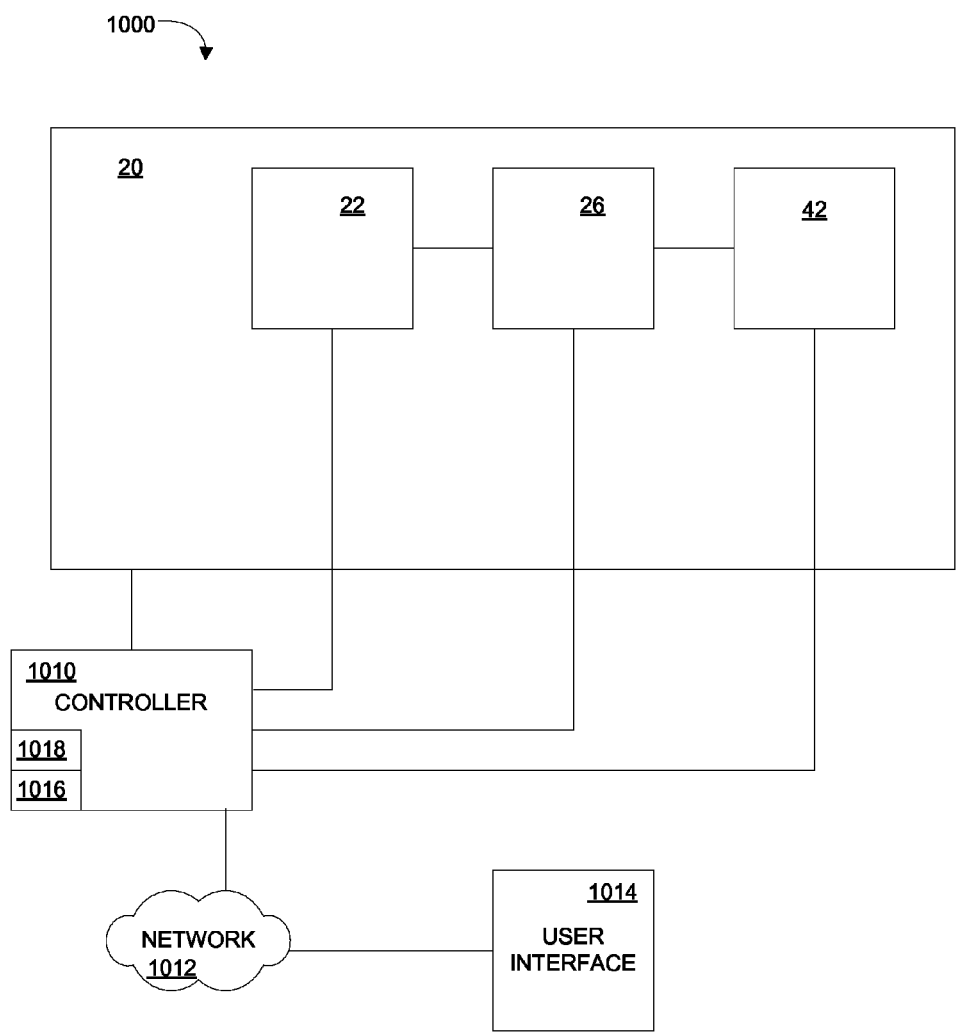
FIG. 10 is a block diagram of an integrated system including the EUV chamber, in accordance with embodiments of the disclosed subject matter.

FIG. 10 is a block diagram of an integrated system 1000 including the EUV chamber 26, in accordance with embodiments of the disclosed subject matter. The integrated system 1000 includes the EUV chamber 26, the light pulse generation system 22, the device 42 utilizing output EUV light 34, and an integrated system controller 1010 coupled to the EUV chamber, the light pulse generation system and the device utilizing output EUV light. The integrated system controller 1010 includes or is coupled to (e.g., via a wired or wireless network 1012) a user interface 1014. The user interface 1014 provides user readable outputs and indications and can receive user inputs and provides user access to the integrated system controller 1010.

The integrated system controller 1010 can include a special purpose computer or a general purpose computer. The integrated system controller 1010 can execute computer programs 1016 to monitor, control and collect and store data 1018 (e.g., performance history, analysis of performance or defects, operator logs, and history, etc.) for the EUV chamber 26, the light pulse generation system 22 and the device 42. By way of example, the integrated system controller 1010 can adjust the operations of the EUV chamber 26, the light pulse generation system 22 and/or the device 42 and/or the components therein (e.g., the target material dispenser 92, etc.) if data collected dictates an adjustment to the operation thereof.

One embodiment provides an extreme ultraviolet light system including a drive laser system, an extreme ultraviolet light chamber, a drive laser steering device, a detection system and a controller. The extreme ultraviolet light chamber including a extreme ultraviolet light collector and a target material dispenser including a target material outlet capable of outputting multiple portions of target material along a target material path. The target material outlet is adjustable. The detection system includes at least one detector directed to detect a reflection of the drive laser reflected from the first one of the portions of target material. The controller is coupled to the target material dispenser, the detector system and the drive laser steering device. The controller includes logic for detecting a location of a first one of the portions of target material from a first light reflected from the first target material and logic for adjusting the target material dispenser outlet to output a subsequent one of the portions of target material to a waist of the focused drive laser.

The drive laser can be aligned with a light path between the drive laser and the first one of the portions of the target material. The detection system can be in line with the light path, and the reflection of the drive laser reflected off of the first one of the portions of the target material is reflected along the light path toward the drive laser. The drive laser system can include an output window and the detection system may not be in line with the light path and the reflection of the drive laser reflected off of the first one of the portions of the target material can be reflected along the light path toward the drive laser output window and the reflection of the drive laser is further reflected off of the output window and toward the detection system.

The system can also include logic for irradiating the second one of the portions of target material with the drive laser. The drive laser steering device can include at least one reflecting surface. The drive laser steering device can further include at least one actuator coupled to the at least one reflecting surface.

The detector directed to detect light reflected from the first target material can include a near field detector and/or a far field detector. The drive laser system can be a CO2 laser. The drive laser system can include a master oscillator power amplifier configuration laser. The drive laser system can include a multi stage amplifier. The drive laser system can include a ZnSe or a diamond output window or any other suitable output window.

The waist of the focused drive laser is in an XY plane normal to a light path of the drive laser along a Z axis. The portions of target material are output along a target material path and the target material path can form an angle to the XY plane.

Another embodiment provides a method of generating an extreme ultraviolet light. The method includes irradiating a first portion one of multiple portions of a target material with a drive laser, detecting a first light pulse reflected from the first portion of the target material, determining a location of the first portion of the target material, adjusting a location of a second one of the portions of the target material to a waist of a focused drive laser, irradiating the second one of the of portions of the target material with the drive laser.

Detecting the first light pulse reflected from the first portion of the target material can include detecting the first light pulse reflected from an output window of the drive laser. Detecting the first light pulse reflected from the first portion of the target material can include determining a near field profile of the first portion of the target material. Detecting the first light pulse reflected from the first portion of the target material can include determining a far field profile of the first portion of the target material. Adjusting the waist of the focused drive laser includes adjusting a position of at least one reflecting surface of the drive laser.

Yet another embodiment provides a method of optimizing an extreme ultraviolet light output. The method includes determining an amount of each one of a first set of EUV output pulses during a selected time interval including for each one of the first set of EUV output pulses including placing a corresponding one of a first set of portions of target material target material in a waist of the focused drive laser, directing a focused drive laser pulse on the corresponding one of the first set of portions of target material, measuring an amount of a corresponding EUV output pulse, and recording the measured corresponding EUV output pulse quantity. Each one of the first set of EUV output pulses is analyzed and a target material position is adjusted in the +Z direction relative to the waist of the focused laser when the greatest peak EUV amount occurs in a first occurring one of the first plurality of EUV output pulses and the target material position is adjusted in −Z direction relative to the waist of the focused laser when the greatest peak EUV amount occurs in a last occurring one of the first plurality of EUV output pulses. The method of can also include determining an integral of the first set of EUV output pulses during the selected time interval.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of generating an extreme ultraviolet light comprising:
    irradiating a reflective surface on a first one of a plurality of portions of a target material with a first drive laser pulse, wherein the first drive laser pulse passes through an aperture in an extreme ultraviolet collector to the reflective surface of the first portion of the target material;
    reflecting the first drive laser pulse off the reflective surface of the first portion of the target material wherein the reflected first drive laser pulse passes through the aperture in the extreme ultraviolet collector to an output window of a drive laser;
    reflecting the reflected first drive laser pulse off of the output window of the drive laser to a detector;
    detecting the reflected first drive laser pulse in the detector;
    determining a location of the first portion of the target material based on the detected reflection;
    outputting the location of the first portion of the target material to a controller, the controller including logic on a computer readable medium for adjusting a location of a second one of the plurality of portions of the target material to a waist of a focused drive laser; and
    irradiating the second one of the plurality of portions of the target material with a second drive laser pulse.

2. The method of claim 1, wherein the reflecting surface of the first portion of target material faces the extreme ultraviolet collector and the reflected first drive laser pulse is reflected through the aperture in the extreme ultraviolet collector to the output window of the drive laser system.

3. The method of claim 1, wherein detecting the reflected first drive laser pulse from the first portion of the target material includes determining at least one of a near field profile of the first portion of the target material or a far field profile of the first portion of the target material.

4. The method of claim 1, wherein adjusting the location of the second one of the plurality of portions of the target material to the waist of the focused drive laser includes translating the waist of the focused drive laser including adjusting a position of at least one reflecting surface of the drive laser.

5. The method of claim 4, wherein adjusting the position of at least one reflecting surface of the drive laser includes adjusting a target material dispenser outlet to output the second one of the plurality of portions of target material to the waist of the focused drive laser.

6. The method of claim 4, wherein adjusting the position of at least one reflecting surface of the drive laser includes translating the location of the waist of the focused drive laser.

7. The method of claim 4, wherein translating the location of the waist of the focused drive laser includes outputting a steering signal from the controller to at least one actuator coupled to a drive laser steering device including at least one reflecting surface.

8. The method of claim 1, wherein the waist of the focused drive laser is in an XY plane normal to a light path of the drive laser along a Z axis.

9. The method of claim 8, wherein the plurality of portions of target material are output along a target material path and wherein the target material path forms an angle between more than 0 degrees and less than 90 degrees relative to the XY plane.

10. The method of claim 1, wherein the drive laser is aligned with a light path between the drive laser and the first one of the plurality of portions of the target material.

11. The method of claim 10, wherein the detection system is in line with at least a portion of the light path, and wherein the reflected drive laser pulse is directed along the light path toward the drive laser output window.

12. The method of claim 1, wherein the drive laser system includes a master oscillator power amplifier configuration laser including at least one amplifier stage.

13. The method of claim 1, wherein the drive laser includes a CO2 laser.

14. A method of steering a drive laser comprising:
    dispensing a first one of a plurality of portions of target material along a target material path, wherein the plurality of portions of target material are dispensed from a target material dispenser having an adjustable target material outlet;
    irradiating a reflective surface on the first portion of target material with a first drive laser pulse;
    reflecting the first drive laser pulse off the reflective surface of the first portion of the target material wherein the reflected first drive laser pulse passes through an aperture in an extreme ultraviolet collector to an output window of a drive laser;
    reflecting the reflected first drive laser pulse off of the output window of the drive laser to a detector;
    detecting the reflected first drive laser pulse in the detector;
    determining a location of the first portion of the target material based on the detected reflection;
    outputting the location of the first portion of the target material to a controller, the controller including logic on a computer readable medium for adjusting a location of a second one of the plurality of portions of the target material to a waist of a focused drive laser; and
    irradiating the second one of the plurality of portions of the target material with a second drive laser pulse.

15. The method of claim 14, further comprising a drive laser steering device disposed to direct the drive laser through the aperture, the drive laser steering device including at least one actuator coupled to the controller.

16. The method of claim 14, wherein the detector includes more than one detector.

17. The method of claim 14, wherein the detector is directed toward the output window of the drive laser system to detect a reflection of a first drive laser pulse reflected from a reflecting surface of the first portion of target material.

18. The method of claim 14, wherein the reflecting surface of the first portion of target material faces the extreme ultraviolet collector and the reflected first drive laser pulse is reflected through the aperture in the extreme ultraviolet collector to the output window of the drive laser system.

* * * * *